US010566971B2

(12) United States Patent
Selvaraj et al.

(10) Patent No.: US 10,566,971 B2
(45) Date of Patent: Feb. 18, 2020

(54) ADAPTIVE PROXIMITY SENSOR

(71) Applicant: Honeywell International Inc., Morris Plains, NJ (US)

(72) Inventors: Radhakrishnan Selvaraj, Bangalore (IN); Manoj Kumar Vadali, Hyderabad (IN); Anuradha Mohan, Bangalore (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/107,028

(22) Filed: Aug. 21, 2018

(65) Prior Publication Data

US 2019/0074832 A1  Mar. 7, 2019

Related U.S. Application Data

(60) Provisional application No. 62/549,133, filed on Aug. 23, 2017.

(51) Int. Cl.
*H03K 17/95* (2006.01)
*H03K 17/945* (2006.01)

(52) U.S. Cl.
CPC ....... *H03K 17/954* (2013.01); *H03K 17/9547* (2013.01); *H03K 2017/9455* (2013.01); *H03K 2217/945* (2013.01)

(58) Field of Classification Search
CPC ............. H03K 17/954; H03K 17/9525; H03K 17/9547; H03K 2017/9455;
(Continued)

(56) References Cited

U.S. PATENT DOCUMENTS

| 4,250,825 A | * | 2/1981 | Kamiyama | ............ D05B 59/02 112/278 |
| 6,452,369 B1 | * | 9/2002 | Lang | ...................... H02J 7/0029 323/285 |

(Continued)

FOREIGN PATENT DOCUMENTS

| CN | 101163599 B | 11/2010 |
| DE | 4123828 C1 | 12/1992 |

(Continued)

OTHER PUBLICATIONS

Fernandes et al., "Power Line Communication in Energy Markets," Cypress Perform, Published in Industrial Control DesignLine (http://www.eetimes.com), pp. 1-15, Aug. 2011.

(Continued)

*Primary Examiner* — Dinh T Le
(74) *Attorney, Agent, or Firm* — Seager, Tufte & Wickhem LLP

(57) ABSTRACT

A proximity sensor or switch having a sensing coil, an oscillator connected to the coil, a comparator connected to the oscillator, a reference voltage module connected to the comparator, and an output driver connected to the comparator. The voltage module may incorporate a resistor having an end connected to a high side of a power source, and a digital potentiometer having a first end connected to another end of the resistor and to the comparator, and having a second end connected to a ground side of the power source. The digital potentiometer may have a resistance that is varied with a signal. A variation of the resistance for the digital potentiometer may result in a change of a voltage from the reference voltage module which further changes a switching distance of the proximity switch to a predetermined value.

11 Claims, 6 Drawing Sheets

(58) Field of Classification Search
CPC .......... H03K 2217/94026; H03K 2217/94031; H03K 2217/945; G06F 13/4072
USPC ........................................................ 327/517
See application file for complete search history.

(56) References Cited

U.S. PATENT DOCUMENTS

| | | | |
|---|---|---|---|
| 7,378,837 B2* | 5/2008 | Andarawis | B81B 3/0021 324/117 R |
| 7,524,424 B2 | 4/2009 | Wittmer et al. | |
| 2010/0225332 A1 | 9/2010 | Niwa et al. | |
| 2011/0238339 A1 | 9/2011 | Fericean et al. | |
| 2019/0101417 A1* | 4/2019 | Patel | G01D 5/245 |

FOREIGN PATENT DOCUMENTS

| | | |
|---|---|---|
| DE | 102005013731 A1 | 9/2006 |
| DE | 102008057725 A1 | 5/2009 |
| JP | S62186614 A | 8/1987 |
| WO | 2009065791 A1 | 5/2009 |

OTHER PUBLICATIONS

Sung et al., "The Sensor Network Using DC Power Line Communication Bus," IEEE Symposium on Computer Applications & Industrial Electronics (ISCAIE), IEEE, pp. 197-200, 2015.

Extended European search report for Application No. 18190339.4, 14 pages, dated Jan. 24, 2019.

\* cited by examiner

ADAPTIVE PROXIMITY SENSOR

This application claims the benefit of U.S. Provisional Application Ser. No. 62/549,133, filed Aug. 23, 2017, and entitled "Adaptive Proximity Sensor". U.S. Provisional Application Ser. No. 62/549,133, filed Aug. 23, 2017, is hereby incorporated by reference.

BACKGROUND

The present disclosure pertains to sensors and particularly to proximity sensors or switches. More particularly, the disclosure pertains to one or more improvements in proximity sensors or switches.

SUMMARY

The disclosure reveals an adaptive proximity sensor, in an expanded way, having a sensing coil, an oscillator connected to the sensing coil, a comparator connected to the oscillator, a reference voltage module connected to the comparator, and an output driver connected to the comparator. The reference voltage module may incorporate a resistor having a first end connected to a high terminal of a power source and having a second end, and a digital potentiometer having a first end connected to the second end of the resistor and to the comparator, and having a second end connected to a ground terminal of the power source. The digital potentiometer may have a resistance that is varied with a signal to the digital potentiometer. A variation of the resistance for the digital potentiometer may result in a change of a voltage from the reference voltage module which further changes the switching distance of the proximity switch to a predetermined or required value. The signal to the digital potentiometer may be superimposed on the power. The signal may be picked off from the power by a demodulator connected to the voltage source and provided to the digital potentiometer.

DESCRIPTION

Figure 1:
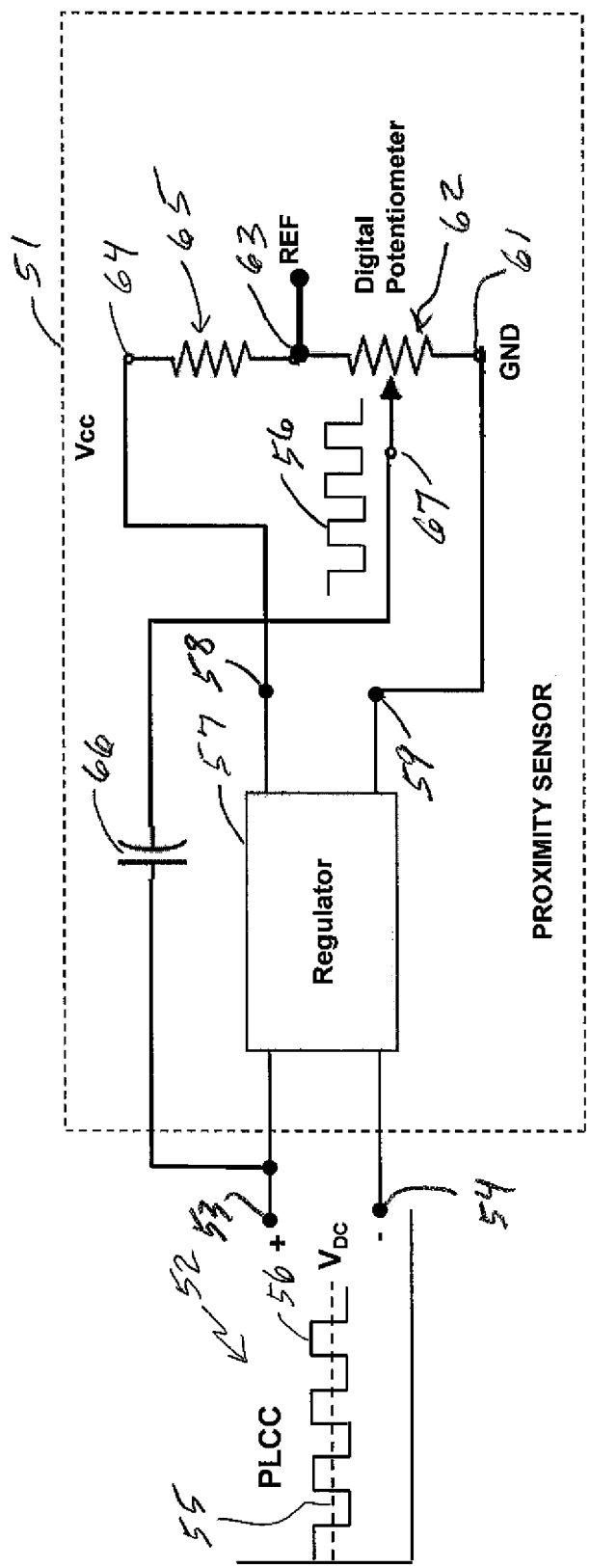
FIG. 1 is a diagram of a proximity sensor scheme.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

The proximity sensor may have components that cause it to result in inaccurate results. For instance, accommodating are part-to-part variation in a coil and the electronics for the proximity sensor may have a laser trim resistor in place to calibrate the sensor. Such proximity sensor may have the following properties. That sensor can be calibrated only once (a customer cannot tune the performance), and laser trimming is a time consuming process with low yields (due to laser trim failures). There may be a higher variation in performance over temperature due to a laser trim resistor (e.g., 100 PPM). Trimming cannot necessarily be done after building the sensor, which causes variation in functional parameters significantly (e.g., heat flow, potting material, and so forth). There often tends to be inconsistent trimming (due to some observed few failures with under and over trimming). Trimming may be an expensive process and considering a field scenario for calibration can be very difficult. Since the calibration should be done before building the complete sensor, lead time may be significant. Also, a field versus plant calibration scenario variation may be significant The present mechanism and approach may avoid the above-noted issues of trimmed resistors with features of the present adaptive and self-calibrating proximity sensor that utilizes a digital potentiometer in-place of a trimmed resistor. The present sensor may operate with multiplexed power supply lines for calibration. A signal needed for tuning the digital potentiometer may be multiplexed (i.e., power line carrier communication (PLCC)) on power supply output wires connected to the sensor. This approach may enable the proximity sensor to be calibrated multiple times over time to accommodate any variations in the system level tolerances. For example, the proximity sensor may be re-calibrated instantly without any interruption to its service. This technique may drastically reduce the lead time.

The adaptive proximity sensor may have a digital potentiometer where the frequency modulated coded signals are input through supply lines of sensor to program the digital potentiometer of the sensor.

With any changes in system level design (target material, target distances, and so forth), unlike other sensors, the present sensor has necessarily no need for replacement components. For instance, the present sensor may be recalibrated to meet new requirements. Performance over a temperature range of the proximity sensor may be greatly improved with one or more digital potentiometers (POTs) as they can be available with very low thermal variation (3 PPM).

Features of the present sensor may include the following items. In field calibration, a technique for proximity sensors may include where a customer can tune the actuation and de-actuation distances. Another feature may be self-calibration and adaptiveness. The Figures herein may reveal further features.

The adaptive proximity sensor may have a digital potentiometer wherein the frequency or amplitude modulated coded signals are input through power supply lines for the sensor to program the digital potentiometer of the sensor.

The trim resistor in a proximity sensor may be replaced with a digital potentiometer. The digital potentiometer may be programmable using square pulses or other shaped pulses to increase or decrease the resistance value based on the distance range to be sensed by the sensor. Other kinds of signals may be used to program the digital potentiometer.

Adjusting the threshold values of the sensor may be done by adjusting the digital potentiometer; however, important are various approaches to program the digital potentiometer by inputting modulated signals through supply lines of the sensor.

Frequency or other kind of modulated coded signals inputted through supply lines of a sensor may be later demodulated to signals that can program the digital potentiometer.

FIG. 1 is a general diagram of a proximity sensor 51 voltage scheme. A PLCC signal 53 may be input to sensor 51 at terminals 53 and 54 of sensor 51. Signal 52 may have a DC voltage 55 with a square wave digital signal 56 superimposed on DC voltage 55. The PLCC signal 52 may go from terminals 53 and 54 to a voltage regulator 57. An output from regulator 57 may be a regulated voltage Vcc at terminal 58 and a ground side at terminal 59 to a terminal 61 of a digital potentiometer 62. The other end of potentiometer 62 may be at a terminal 63. The Vcc at terminal 58 may go to a terminal 64 of a resistor 65. The other end of resistor 65 may be at terminal 63. Resistors 62 and 65 may form a voltage divider with a reference voltage at terminal 63.

Square wave or digital signal 56 may be picked off from signal 52 with a capacitor 66 having one end connected to terminal 53 and the other end connected a terminal 67 of digital potentiometer 62. Signal 56 digitally indicates a resistance value setting of potentiometer 62. The resistance value setting of potentiometer 62 may determine a voltage reference value at terminal 63. A change of signal 56 may change the resistance value of potentiometer 62 and thereby change the voltage at terminal 63 and in turn adjust the reference voltage on that terminal without a need of a pre-trimmed resistor.

Figure 3:
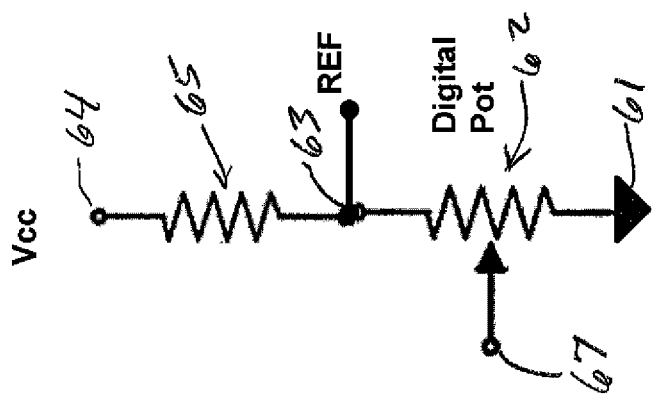
FIG. 3 reveals a diagram of the resistor network having a digital potentiometer as a replacement of the trim resistor.
Figure 2:
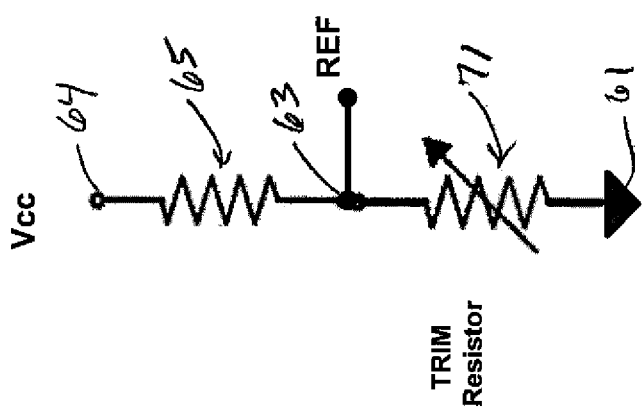
FIG. 2 reveals a diagram of a resistor network having a trim resistor.
Figure 4:
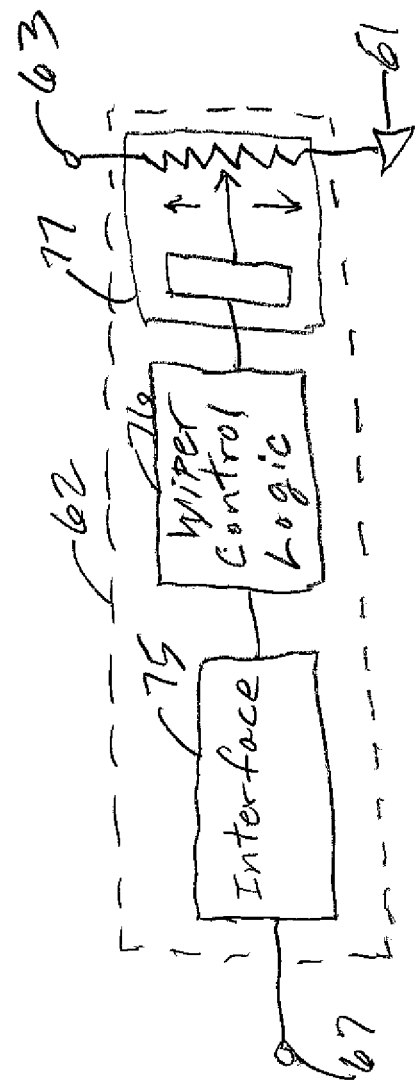
FIG. 4 is a diagram showing an example of details of the digital potentiometer.

FIG. 2 reveals a diagram of a resistor network 65 having a trim resistor 71. FIG. 3 reveals a diagram of network 65 having a digital potentiometer 62 as a replacement of trim resistor 71. FIG. 4 is a diagram showing details of an example digital potentiometer 62. There may be various other examples of digital potentiometers. In the present example, signal 56 may enter interface 75 via terminal 67. A processed signal may go to wiper control logic 76 for conversion, as needed, to a signal that goes as an electronic signal to resistance converter 77. Converter 77 may be an electronic converter or an electronic-to-mechanical converter that provides control of a wiper that slides up and down a resistor to provide a certain resistance for the voltage divider to attain a desired reference voltage at terminal 63. The reference voltage may be positively adjusted.

Figure 5:
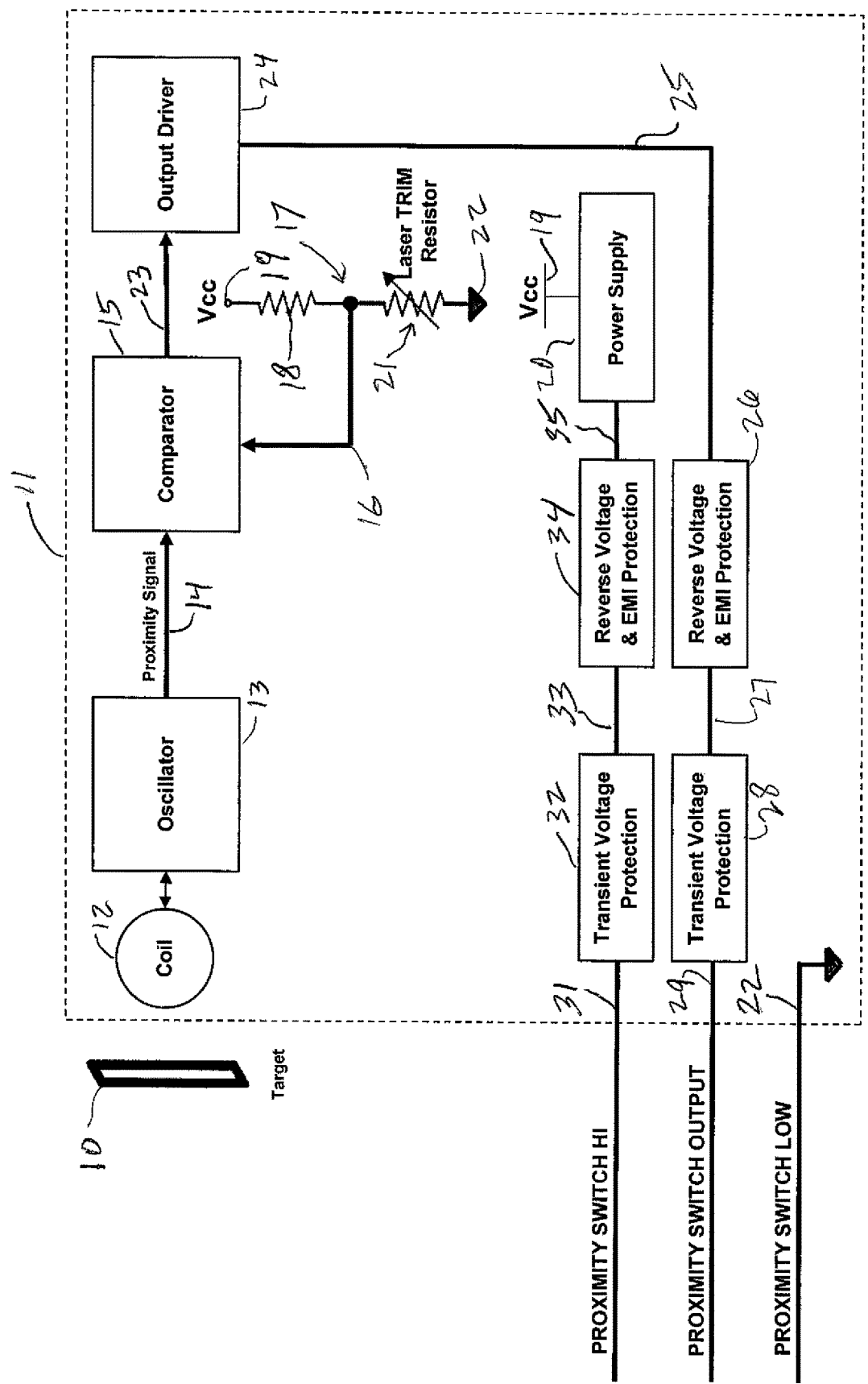
FIG. 5 is a diagram of a version of a proximity switch.

FIG. 5 is a diagram showing one version of proximity switches such as a proximity switch 11. A detection coil 12 may be connected to an oscillator 13. Coil 12 which may have a signal fed to it that has one or more characteristics that may include frequency, frequency variation, amplitude, amplitude variation, and/or other particular characteristics. For instance, a coil 12 is at a certain distance from target 10, approaches or recedes from target 10, one or more characteristics may reflect a condition of target 10 relative to coil 12. The characteristics may be communicated along connection 14 as a proximity signal to a comparator 15. The proximity signal may be compared to a reference voltage on a line 16 to indicate distance or movement of target 10. The comparison may be that of amplitudes of the proximity signal and the reference voltage.

The reference voltage may be provided by a voltage divider 17. A resistor 18 may have one end connected to a Vcc 19 from a voltage supply 20, and another end connected to line 16. A resistor 21 may have one end connected to line 16 and a second end connected to a ground 22. Resistor 21 may have a value that is adjusted to obtain the reference voltage of a predetermined or desired magnitude as an input to comparator 15. Resistor 21 may be laser-trimmed to obtain the reference voltage of a particularly specific value by which the comparator depends on is as to provide an accurate proximity value or distance between coil 12 and target 10. Resister 21 may be trimmed (i.e., calibrated) to get a needed reference voltage which sets a needed sensing distance.

A signal may go from comparator 15 along a line 23 to an output driver 24. Output driver 24 may condition the signal on line 23 as an appropriate output to be sent out on line 25, through a reverse voltage and electromagnetic interference (EMI) protection block 26. An output from block 26 may go on line 27 to a transient voltage protection block 28. An output form block 28 may be a final output from the proximity switch on a line 29, which can be labeled "proximity switch output".

Other lines, besides line 29, for an electrical interface with proximity switch 11 may incorporate line 31 labeled "proximity switch hi" and line 22 labeled "proximity switch low". Line 31 and line 22 may provide electrical power, hot and ground, respectively, for proximity switch 11. The power on line 31 may go through a transient voltage protection block 32. An output from block 32 may go via a line 33 to a reverse voltage and EMI protection block 34. From block 34, an output may go via a line 35 to power supply 20, which may have a regulator and other components to provide a stable Vcc 19.

Figure 6:
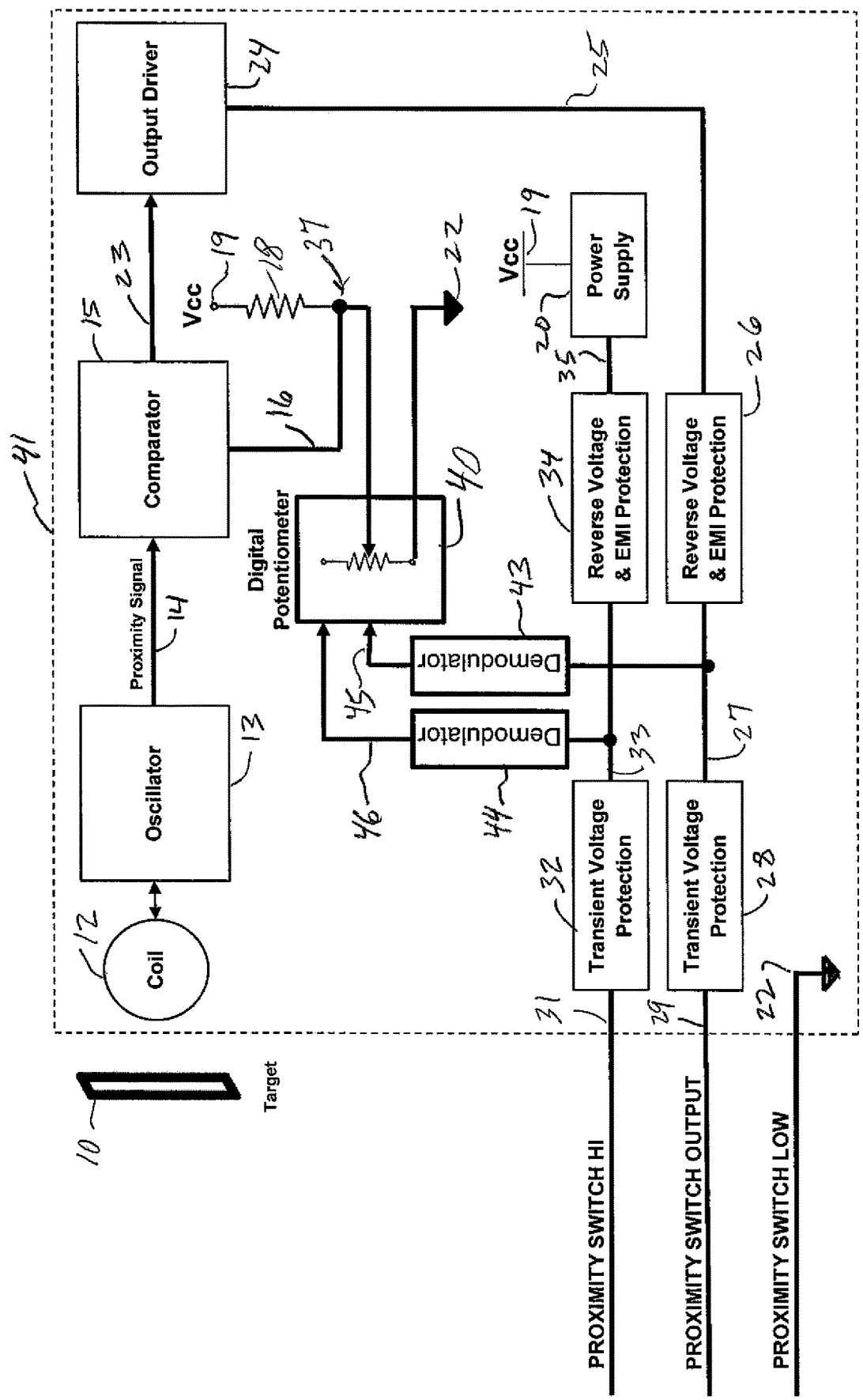
FIG. 6 is a diagram of a proximity switch that has a dynamically adjustable reference voltage.

FIG. 6 is a diagram of a proximity sensor or switch 41 that appears to have a dynamically adjustable resistor network 37 for a voltage reference adjustment. In proximity sensor 41, laser trim resistor 21 of a like proximity sensor switch 11 may be replaced with a programmable digital potentiometer 40 plus some additional electronics thus resulting in proximity switch or sensor 41. The first end of resistor 18 may be connected to voltage 19 (Vcc). Potentiometer 40 may have a first terminal connected to the other or second end of resistor 18 and to line 16 that goes to comparator 15. Potentiometer 40 may have a second terminal connected to ground 22. The first terminal connection of potentiometer 40 may be regarded as the reference voltage.

Resistor 18 and potentiometer 40 may be regarded as a voltage network or divider 37. Potentiometer 40 may be dynamically adjusted during operation of proximity sensor 41, to obtain the reference voltage of a predetermined or desired magnitude as an input comparator 15.

During a calibration process, proximity sensor supply line 31 and output line 29 may be supplied with a DC superimposed modulated signal. The superimposed modulated signal from output line 29, voltage protection module 28 and line 27, may go to a demodulator 43, which upon demodulation provides a clock signal on a line 45 that goes to potentiometer 40.

The superimposed modulated signal from output line 31, via a transient voltage protection module 32 and line 33, may go to a demodulator 44, which upon demodulation provides data or an up-down control signal on a line 45 that goes to potentiometer 40. The demodulated signals to potentiometer 40 on lines 45 and 46 may be designed or selected to increase or decrease a resistor value of potentiometer 40 to change the reference voltage on line 16 from voltage divider 37 to comparator 15.

Figure 7:
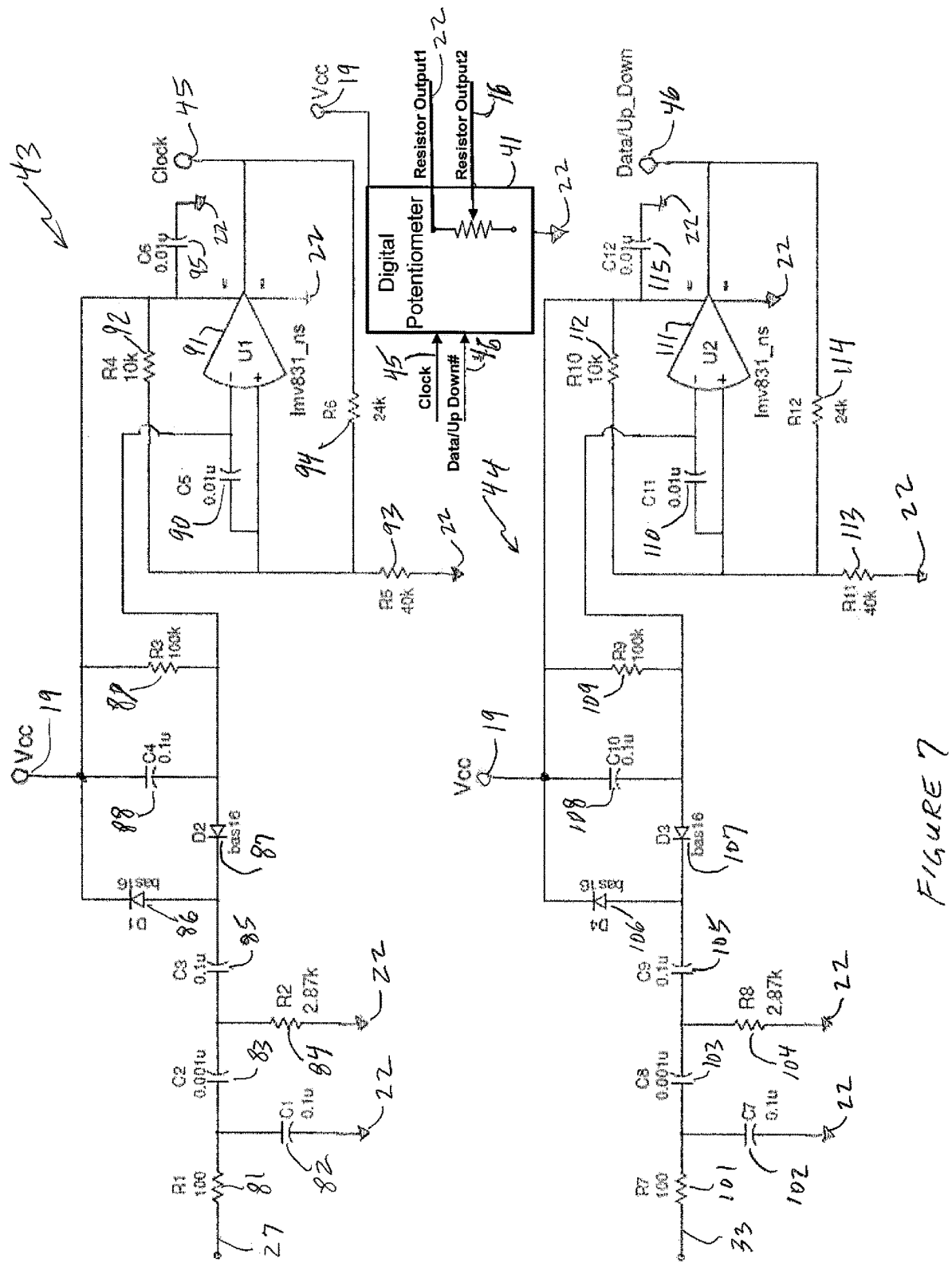
FIG. 7 is a diagram of a circuit for two demodulators.

FIG. 7 is a diagram of a circuit for demodulator 43 and demodulator 44. A signal on line 27 may be the "proximity switch output" of line 29 after transient voltage protection block 28. Details of an example demodulator 43 and 44 are noted but the respective the circuits could have instead different details and components for the same use.

A first end of a 100 ohm resistor 81 may be connected to line 27, and a second end of resistor 81 may be connected to a first end of a 0.1 microfarad capacitor 82 and a first end of a 0.001 microfarad capacitor 83. A second end of capacitor 82 may be connected to ground 22. A second end of capacitor 83 may be connected to a first end of a 2.87K ohm resistor 84, and to a first end of a 0.1 microfarad capacitor 85. A second and of resistor 84 may be connected to ground 22. A second end of capacitor 85 may be connected to an anode of a diode 86 and to a cathode of a diode 87. A cathode of diode 86 may be connected to Vcc 19. An anode of diode 87 may be connected to a first end of a 0.1 microfarad capacitor 88, a first end of a 100K ohm resistor 89, a first end of a 0.01 microfarad capacitor 90, and an inverting input of an operational amplifier 91.

A second end of capacitor 88 and a second end of resistor 89 may be connected to Vcc 19. A second end of capacitor 90 may be connected to a non-inverting input of operational amplifier 91, a first end of a 10K ohm resistor 92, a first end of a 40K ohm resistor 93, and a first end of a 24K ohm resistor 94. A second end of resistor 92 may be connected to Vcc 19. A second end of resistor 93 may be connected to ground 22. A 0.01 microfarad capacitor 95 may have a first end connected to Vcc 19 and have a second end connected to ground 22. An output of operational amplifier 91 may be clock output 45 of modulator 43. Output 45 may be connected to a second end of resistor 94. For power, operational amplifier 91 may have connections to Vcc 19 and ground 22.

A first end of a 100 ohm resistor 101 may be connected to line 33, and a second end of resistor 101 may be connected to a first end of a 0.1 microfarad capacitor 102 and a first end of a 0.001 microfarad capacitor 103. A second end of capacitor 102 may be connected to ground 22. A second end of capacitor 103 may be connected to a first end of a 2.87K ohm resistor 104 and to a first end of a 0.1 microfarad capacitor 105. A second end of resistor 104 may be connected to ground 22. A second end of capacitor 105 may be connected to an anode of a diode 106 and to a cathode of a diode 107. A cathode of diode 106 may be connected to Vcc 19. An anode of diode 107 may be connected to a first end of a 0.1 microfarad capacitor 108, a first end of a 100K ohm resistor 109, a first end of a 0.01 microfarad capacitor 110, and an inverting input of an operational amplifier 111.

A second end of capacitor 108 and a second end of resistor 109 may be connected to Vcc 19. A second end of capacitor 110 may be connected to a non-inverting input of a 10K ohm resistor 112, a first end of a 40K ohm resistor 113, and a first end of a 40K ohm resistor 114. A second end of resistor 112 may be connected to Vcc 19. A second end of resistor 113 may be connected to ground 22. A 0.01 microfarad capacitor 115 may have a first end connected to Vcc 19 and have a second end connected to ground 22. An output of operational amplifier 111 may be output 46 of modulator 44. Output 46 may be connected to a second end of resistor 114. For power, operational amplifier 111 may have connections of Vcc 19 and ground 22.

Clock output 45 of modulator 43 may be connected to a clock input of potentiometer 40. Data or up-down output 46 may be connected to data or up-down input 46 of potentiometer 40. Data or up-down may mean increase or decrease of resistance of potentiometer 40. A first resistor output of potentiometer 40 may be connected to ground 22. A second resistor output of potentiometer 40 may be connected to reference voltage line 16. For power of potentiometer 40, such as its electronics, if any, Vcc 19 and ground 22 may be connected to potentiometer 40.

Rather than designing and fabricating potentiometer 40 for the present proximity switch system, an appropriate digital potentiometer available on the market may be used.

To recap, an adaptive proximity detection system may incorporate a sensing coil, an oscillator connected to the sensing coil, a comparator connected to the oscillator, a reference voltage module connected to the comparator, and an output driver connected to the comparator. The reference voltage module may incorporate a resistor having a first end connected to a high terminal of a voltage source and having a second end, a digital potentiometer having a first end connected to the second end of the resistor and to the comparator, and having a second end connected to a ground terminal of the voltage source.

The digital potentiometer may have a resistance that is varied with a signal to the digital potentiometer.

A variation of the resistance for the digital potentiometer may result in a change of a reference voltage from the reference voltage module.

The signal may be superimposed on power from the voltage source. The signal may be picked off from the power by a demodulator connected to the voltage source.

The signal may be a frequency modulated signal, an amplitude modulated signal, or another kind of modulated signal.

The reference voltage may be adjusted or calibrated with the signal.

The demodulator may pick the signal off from the power with a capacitive circuit.

A dynamically calibrated proximity sensor may incorporate a detector that has an inductance that varies upon a proximity to an inductance-affecting target, an oscillator connected to the detector, that outputs a signal that has an amplitude that varies with the inductance of the detector, a comparator connected to the oscillator that compares that amplitude of the signal from the oscillator with a reference voltage, an output driver connected to the comparator to provide an output to indicate a target proximity, and a resistor network to provide the reference voltage for the comparator. The resistor network may have a resistance that is dynamically varied to adjust the reference voltage to a predetermined value. The resistor network may incorporate a digital potentiometer that can vary the resistance of the resistor network with a control signal to the digital potentiometer.

The sensor may further incorporate a high line and a ground line for providing power to the resistor network, and a demodulator connected to the high line, the ground line, and the resistor network. The high line may be provided a DC superimposed modulated signal by a modulator. The DC superimposed modulated signal may be demodulated by the demodulator into the control signal to the digital potentiometer to increase or decrease the resistance of the resistor network.

An input control signal to the modulator may result in the DC superimposed modulated signal.

The output to indicate a target proximity from the output driver may be a proximity sensor output. In a calibration process, if proximity sensor output is different from the predetermined value, then the voltage detector may send an increase or decrease signal to the modulator which provides the DC superimposed modulated signal that goes to the demodulator to be demodulated into an input control signal to the digital potentiometer to increase or decrease the resistance of the resistor network to increase or decrease the reference voltage to remove a difference between the proximity sensor output and the predetermined value. During the calibration process, the target may be placed at a required or predetermined distance from the sensing coil.

The sensor may further incorporate a transient voltage protection module on the high line before a connection of the high line to the demodulator.

The sensor may further incorporate a voltage regulator between the high line and the power to the resistor network.

The sensor may further incorporate a reverse voltage and electromagnetic interference protection module on the high line before a connection of the high line to the voltage regulator.

A proximity sensor voltage reference may incorporate a power source, a regulator having a first terminal and a second terminal connected to the power source, a voltage divider circuit connected across the first and second terminals of the regulator, and a capacitor having a first end connected to the first terminal of the regulator source and having a second end connected to the voltage divider. The voltage divider circuit may incorporate a first resistor having a first end that is connected to the first terminal of the regulator and a second end connected to a potentiometer reference voltage terminal, and a second resistor having a first end connected to the reference voltage terminal and having a second end connected to the second terminal of the regulator. The second resistor may have a digital potentiometer with a first terminal that corresponds to the first end of the second resistor, a second terminal that corresponds to the second end of the second resistor, and a third terminal connected to the second end of the capacitor.

The digital potentiometer may have a resistance that can be varied with a signal provided to the third terminal.

The signal may be a waveform multiplexed on a DC power supply provided to the first and second terminals of the regulator.

The waveform may an alternating signal that is picked off from the DC power supply.

The signal to the third terminal of the digital potentiometer may affect the resistance of the digital potentiometer with variation of the alternating signal in a varying way selected from a group of characteristics comprising frequency, amplitude, and shape.

A variation of resistance of the digital potentiometer affects a magnitude of the reference voltage. The reference voltage may be dynamically adjusted in accordance with needs of a system that the reference voltage supports.

U.S. Pat. No. 9,234,768, issued Jan. 12, 2016, is hereby incorporated by reference.

Any publication or patent document noted herein is hereby incorporated by reference to the same extent as if each individual publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. An adaptive proximity detection system comprising:
   a sensing coil;
   an oscillator connected to the sensing coil;
   a comparator connected to the oscillator;
   a reference voltage module connected to the comparator; and
   an output driver connected to the comparator; and
   wherein:
   the reference voltage module comprises:
      a resistor having a first end connected to a high terminal of a voltage source and having a second end; and
      a digital potentiometer having a first end connected to the second end of the resistor and to the comparator, and having a second end connected to a ground terminal of the voltage source;
   the digital potentiometer has a resistance that is varied with a signal to the digital potentiometer;
   the signal is superimposed on power from the voltage source; and
   the signal is picked off from the power by a demodulator connected to the voltage source.

2. The detection system of claim 1, wherein a variation of the resistance for the digital potentiometer results in a change of a reference voltage from the reference voltage module.

3. The detection system of claim 1, wherein the signal is a frequency modulated signal.

4. The detection system of claim 2, wherein the reference voltage is adjusted or calibrated with the signal.

5. The detection system of claim 1, wherein the demodulator picks the signal off from the power with a capacitive circuit.

6. A dynamically calibrated proximity sensor comprising:
   a detector that has an inductance that varies upon a proximity to an inductance-affecting target;
   an oscillator connected to the detector, that outputs a signal that has an amplitude that varies with the inductance of the detector;
   a comparator connected to the oscillator that compares that amplitude of the signal from the oscillator with a reference voltage;
   an output driver connected to the comparator to provide an output to indicate a target proximity;
   a resistor network to provide the reference voltage for the comparator;
   a high line and a ground line for providing power to the resistor network; and
   a demodulator connected to the high line and the resistor network; and
   wherein:
   the resistor network has a resistance that is dynamically varied to adjust the reference voltage to a predetermined value; and
   the resistor network comprises a digital potentiometer that can vary the resistance of the resistor network with a control signal to the digital potentiometer;
   the high line is provided a DC superimposed modulated signal by a modulator; and
   the DC superimposed modulated signal is demodulated by the demodulator into the control signal to the digital potentiometer to increase or decrease the resistance of the resistor network.

7. The sensor of claim 6, wherein an input control signal to the modulator results in the DC superimposed modulated signal.

8. The sensor of claim 6, wherein:
   the output to indicate a target proximity from the output driver is a proximity sensor output;
   in a calibration process, if proximity sensor output is different from the predetermined value, then the voltage detector sends an increase or decrease signal to the modulator which provides the DC superimposed modulated signal that goes to the demodulator to be demodulated into an input control signal to the digital potentiometer to increase or decrease the resistance of the resistor network to increase or decrease the reference voltage to remove a difference between the proximity sensor output and the predetermined value; and during the calibration process, the target is placed at a predetermined or required distance from the sensing coil.

9. The sensor of claim 8, further comprising a transient voltage protection module on the high line before a connection of the high line to the demodulator.

10. The sensor of claim 8, further comprising a voltage regulator between the high line and the power to the resistor network.

11. The sensor of claim 10, further comprising a reverse voltage and electromagnetic interference protection module on the high line before a connection of the high line to the voltage regulator.

\* \* \* \* \*